(12) United States Patent
Fjelstad et al.

(10) Patent No.: US 7,014,472 B2
(45) Date of Patent: Mar. 21, 2006

(54) SYSTEM FOR MAKING HIGH-SPEED CONNECTIONS TO BOARD-MOUNTED MODULES

(75) Inventors: Joseph C. Fjelstad, Maple Valley, CA (US); Para Segaram, Campbell, CA (US); Thomas Obenhuber, San Francisco, CA (US); Gary Yasumura, Santa Clara, CA (US)

(73) Assignee: SiliconPipe, Inc., San Jose, CA (US)

( * ) Notice: Subject to any disclaimer, the term of this patent is extended or adjusted under 35 U.S.C. 154(b) by 0 days.

(21) Appl. No.: 10/756,924

(22) Filed: Jan. 13, 2004

(65) Prior Publication Data

US 2005/0014395 A1    Jan. 20, 2005

Related U.S. Application Data

(60) Provisional application No. 60/439,881, filed on Jan. 13, 2003.

(51) Int. Cl.
*H01R 12/00* (2006.01)
*H05K 1/00* (2006.01)

(52) U.S. Cl. ......................................... 439/65; 439/637
(58) Field of Classification Search ................. 439/65, 439/637, 61
See application file for complete search history.

(56) References Cited

U.S. PATENT DOCUMENTS

| | | | |
|---|---|---|---|
| 3,795,845 A | 3/1974 | Cass et al. | |
| 4,095,866 A | 6/1978 | Merrill | |
| 4,202,007 A | 5/1980 | Dougherty et al. | |
| 4,302,501 A | 11/1981 | Nagashima | |
| 4,445,735 A | 5/1984 | Bonnefoy | |
| 4,458,297 A | 7/1984 | Stopper et al. | |
| 4,543,715 A | 10/1985 | Iadarola et al. | |
| 4,551,673 A | 11/1985 | Barth et al. | |
| 4,636,919 A | 1/1987 | Itakura et al. | |
| 4,675,243 A | 6/1987 | Obinata et al. | |
| 4,730,159 A | 3/1988 | Collins | |
| 4,731,643 A | 3/1988 | Dunham et al. | |
| 4,748,495 A | 5/1988 | Kucharek | |
| 4,768,154 A | 8/1988 | Sliwkowski et al. | |
| 4,799,617 A | 1/1989 | Friedman | |
| 4,812,792 A | 3/1989 | Leibowitz | |
| 4,814,945 A | 3/1989 | Leibowitz | |
| 4,838,800 A | 6/1989 | Lynch | |
| 4,861,251 A | 8/1989 | Moitzger | |
| 4,881,905 A | 11/1989 | Demler, Jr. et al. | |
| 4,912,603 A | 3/1990 | Seyama | |
| 4,935,584 A | 6/1990 | Boggs | |
| 4,956,749 A | 9/1990 | Chang | |
| 4,960,386 A | 10/1990 | Stanevich | |

(Continued)

OTHER PUBLICATIONS

PCT International Search Report, dated Nov. 3, 2003, 8 pages.

*Primary Examiner*—Javaid H. Nasri
(74) *Attorney, Agent, or Firm*—Shemwell Mahamedi LLP

(57) ABSTRACT

A device module may be used to carry a plurality of devices, such as memory devices or other components. The device module may include a board, a first set of contact points, and a second set of contact points. A plurality of signal paths may be provided on the board, where each signal path extends between a contact point in the first set and a contact point in the second set. Each of the plurality of signal paths has substantially an identical length and a same number of turns on the board.

16 Claims, 9 Drawing Sheets

U.S. PATENT DOCUMENTS

| | | |
|---|---|---|
| 4,969,826 A | 11/1990 | Grabbe |
| 4,982,311 A | 1/1991 | Dehaine et al. |
| 4,991,115 A | 2/1991 | Guthrie et al. |
| 4,994,938 A | 2/1991 | Baudouin |
| 5,009,611 A | 4/1991 | Regnier |
| 5,012,924 A | 5/1991 | Murphy |
| 5,019,946 A | 5/1991 | Eichelberger et al. |
| 5,136,123 A | 8/1992 | Kobayashi et al. |
| 5,155,577 A | 10/1992 | Chance et al. |
| 5,162,792 A | 11/1992 | Morris |
| 5,165,984 A | 11/1992 | Schoenthaler |
| 5,185,502 A | 2/1993 | Shepherd et al. |
| 5,220,490 A | 6/1993 | Weigler et al. |
| 5,222,014 A | 6/1993 | Lin |
| 5,227,013 A | 7/1993 | Kumar |
| 5,291,375 A | 3/1994 | Mukai |
| 5,309,324 A | 5/1994 | Herandez et al. |
| 5,319,224 A | 6/1994 | Sakashita et al. |
| 5,417,577 A | 5/1995 | Holliday et al. |
| 5,424,492 A | 6/1995 | Petty et al. |
| 5,441,917 A | 8/1995 | Rostoker et al. |
| 5,490,040 A | 2/1996 | Gaudenzi et al. |
| 5,491,364 A | 2/1996 | Brandenburg et al. |
| 5,498,767 A | 3/1996 | Huddleston et al. |
| 5,500,862 A | 3/1996 | Kawamura |
| 5,544,018 A | 8/1996 | Sommerfeldt et al. |
| 5,545,301 A | 8/1996 | Friese et al. |
| 5,578,870 A | 11/1996 | Farnsworth et al. |
| 5,584,721 A | 12/1996 | Taniuchi et al. |
| 5,587,944 A | 12/1996 | Shen et al. |
| 5,596,205 A | 1/1997 | Reedy et al. |
| 5,634,093 A | 5/1997 | Ashida et al. |
| 5,635,424 A | 6/1997 | Rostoker et al. |
| 5,644,500 A | 7/1997 | Miura et al. |
| 5,684,332 A | 11/1997 | Chen et al. |
| 5,686,699 A | 11/1997 | Chu et al. |
| 5,691,569 A | 11/1997 | Palmer |
| 5,706,178 A | 1/1998 | Barrow |
| 5,715,724 A | 2/1998 | Rostoker et al. |
| 5,729,432 A | 3/1998 | Shim et al. |
| 5,730,606 A | 3/1998 | Sinclair |
| 5,745,374 A | 4/1998 | Matsumoto |
| 5,774,340 A | 6/1998 | Chang et al. |
| 5,781,446 A | 7/1998 | Wu |
| 5,784,262 A | 7/1998 | Sherman |
| 5,784,264 A | 7/1998 | Sherman |
| 5,786,631 A | 7/1998 | Fishley et al. |
| 5,790,383 A | 8/1998 | Inagawa |
| 5,819,403 A * | 10/1998 | Crane et al. .................. 29/841 |
| 5,822,214 A | 10/1998 | Rostoker et al. |
| 5,977,640 A | 11/1999 | Bertin et al. |
| 6,087,732 A | 7/2000 | Chittipeddi et al. |
| 6,121,679 A | 9/2000 | Luvara et al. |
| 6,137,064 A | 10/2000 | Kiani et al. |
| 6,150,729 A | 11/2000 | Ghahghahi |
| 6,264,476 B1 | 7/2001 | Li et al. |
| 6,285,560 B1 | 9/2001 | Lyne |
| 6,304,450 B1 | 10/2001 | Dibene, II et al. |
| 6,310,303 B1 | 10/2001 | Luvara et al. |
| 6,310,398 B1 | 10/2001 | Katz |
| 6,388,208 B1 | 5/2002 | Kiani et al. |
| 6,507,496 B1 | 1/2003 | Levy et al. |
| 6,547,570 B1 | 4/2003 | Eskildsen et al. |
| 6,559,531 B1 | 5/2003 | Sutherland |
| 6,594,811 B1 | 7/2003 | Katz |
| 6,686,666 B1 | 2/2004 | Bodas |
| 6,704,204 B1 | 3/2004 | Eskildsen et al. |

* cited by examiner

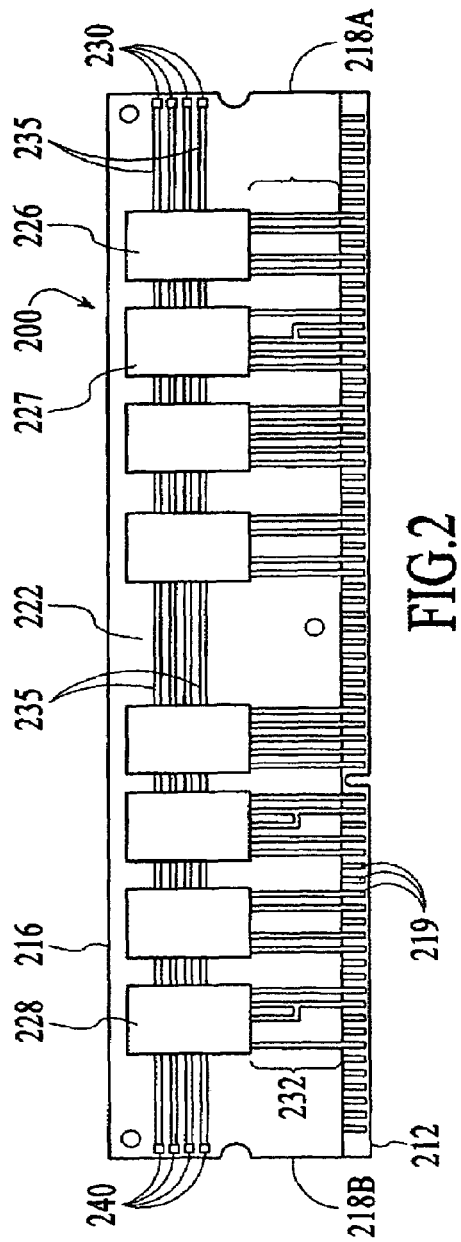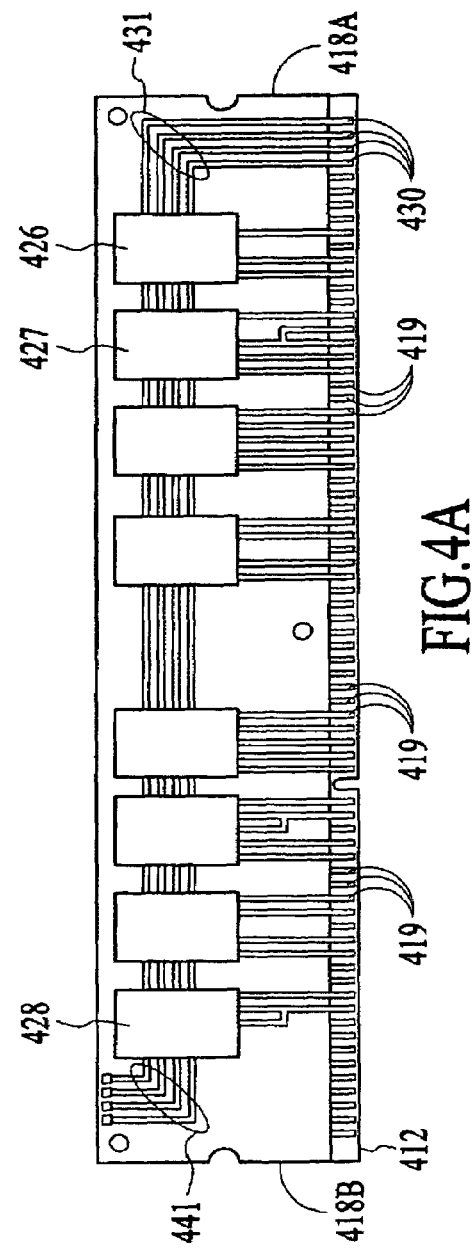

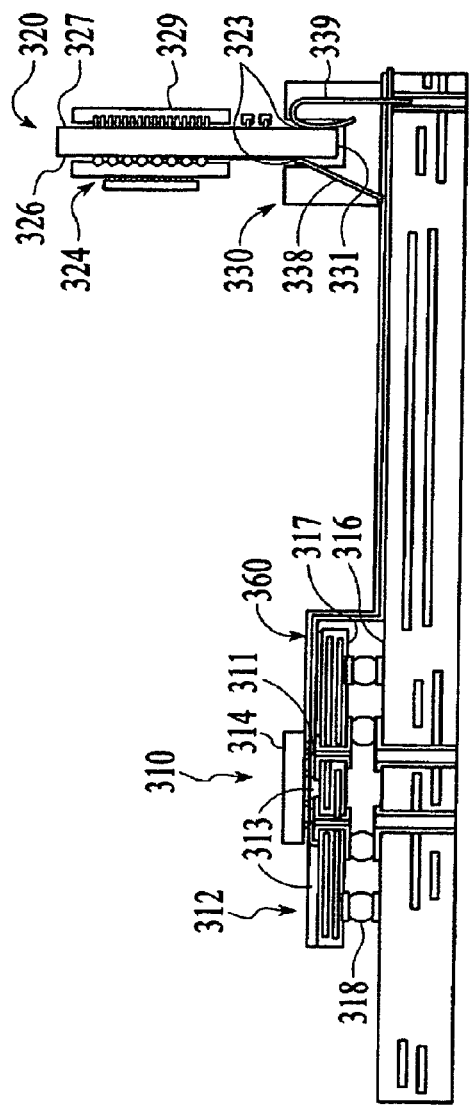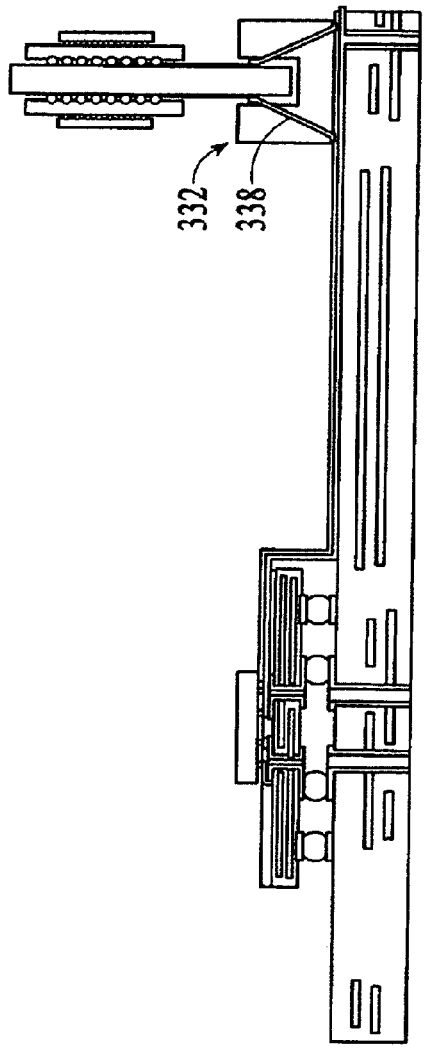
FIG.3A
FIG.3B

SYSTEM FOR MAKING HIGH-SPEED CONNECTIONS TO BOARD-MOUNTED MODULES

RELATED APPLICATIONS

This application claims benefit of priority to Provisional U.S. Patent Application No. 60/439,881, entitled STRUCTURES AND METHOD FOR CREATING A HIGH-SPEED MEMORY OR VIDEO BUSSES, filed on Jan. 13, 2003. The aforementioned priority application is hereby incorporated by reference in its entirety for all purposes.

TECHNICAL FIELD

This invention relates generally to the data busses. More particularly, the invention relates to the field of high-speed interconnectivity amongst motherboard components.

BACKGROUND

Computer components such as memory are typically accessible from different locations in any given system. On a computer motherboard, for example, a Level 1 cache is located on the IC chip, while the Level 2 cache is frequently located in nearby modules. To access the main memory, an electrical or electronic buss is commonly used to transmit signals between the CPU and the main memory of the computer, or as the case may be, of the video module or plug-in card. In practice, the speed or performance of a computer (or of the video module or plug-in card) is very often more limited by capabilities of the buss between memory and CPU and its design, than by the operating speed of the microprocessor.

Traditional approaches to memory buss structures and methods for their creation have thus far been limited to the use of circuit traces that are an integral part of the circuit board that interconnects the memory modules to the CPU. This has not been a significant matter of concern in the past, because memory devices operated fairly slowly. With newer memory architectures, however, it is possible to run memory much faster, but even this improvement has been impeded by buss design. Thus, the full capabilities of the memory components are typically not achieved.

BRIEF DESCRIPTION OF THE DRAWINGS

FIG. 2 illustrates a device module design in which a plurality of board leads are arranged on a module board for purpose of facilitating or otherwise enabling faster and better quality connections to be made with the device module.

FIGS. 3A and 3B are cross-sectional views of alternative embodiments in which a controller or other motherboard component is interconnected with a device module using a high-speed connection.

FIG. 4A illustrates a device module design in which a plurality of board leads are arranged on a module board for purpose of facilitating or otherwise enabling faster and better quality connections made form outside signal lines that are connected to a bottom end or portion of a device module.

In the drawings, the same reference numbers identify identical or substantially similar elements or acts. Any modifications necessary to the Figures can be readily made by one skilled in the relevant art based on the detailed description provided herein.

DETAILED DESCRIPTION

A. Overview

Figure 1A:
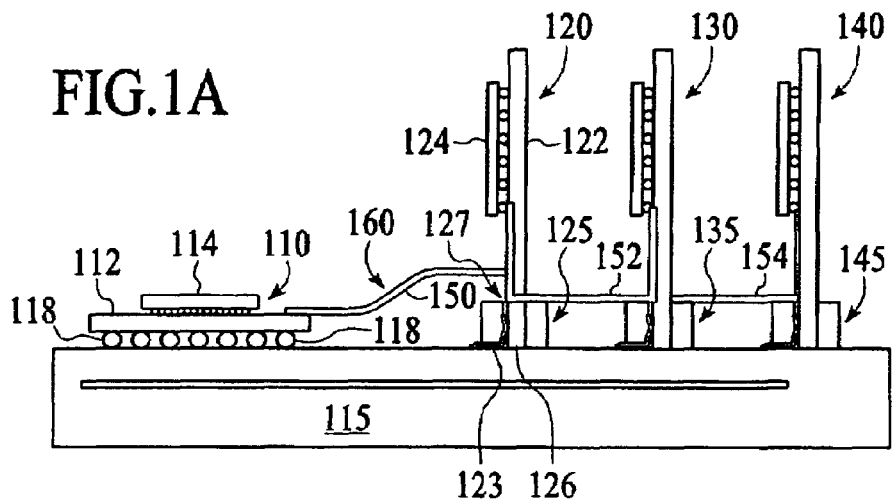
FIG. 1A illustrates a system where a bus is directly connected to a device module in order to enable direct communication between a motherboard component and that device module, according to an embodiment.

Embodiments of the invention provide for high-speed data connectivity and transfer amongst components of motherboards and other substrates. Various mechanisms and designs are employed in order to maximize signal integrity, minimize signal degradation, improve transfer speed and control impedance.

According to an embodiment, a device module is provided. The device module may be used to carry a plurality of devices, such as memory devices or other components. The device module may include a board, a first set of contact points, and a second set of contact points. A plurality of signal paths may be provided on the board, where each signal path extends between a contact point in the first set and a contact point in the second set. According to an embodiment, each of the plurality of signal paths has substantially an identical length and a same number of turns on the board.

As used herein, the term "substantially an identical length" in the context of two or more signal paths means that each signal path carries signals that when started and terminated at identical points on a straight line, have skew that is less than or equal to one-fourth the operational frequency of the system that generated the signals.

In another embodiment, a device module is provided having a board and a plurality of devices. In one embodiment, the device module includes at least one set of signal paths that have no turns. In another embodiment, the device module includes at least one set of signal paths that individually have two or fewer number of turns. In either embodiment, the overall length of the signal paths on the board are substantially identical.

As used herein, the term "signal path" means the path of a signal generated from one source and communicated directly or indirectly to another device. It is understood that the signal can be intercepted or otherwise processed by one or more intermediary devices The term "turn" means a change in direction. For example, a turn in a signal path may include an elbow, or a 90 degree change in direction.

In another embodiment, a system is described for providing high-speed interconnectivity between a controller and a plurality of memory devices. The system may include a set of one or more boards upon which a plurality of memory devices are provided. The set includes at least a first board on which at least some of the plurality of memory devices are provided. A plurality of signal paths may be provided on the first board, where each signal path includes a first set of contact points that interconnect the first board to the controller from a position that is proximate to one of the board's lateral sides. A second set of contact points may interconnect the board to another component from another position that is proximate to a second lateral side of the first board. Each of the plurality of signal paths has a substantially identical length and an identical number of turns between a contact point in the first set of contact points and a contact point in the second set of contact points.

B. Direct Connection to Device Modules

FIG. 1A illustrates an embodiment in which a controller 110 (or other motherboard component) is directly connected to a device module. In an embodiment such as shown by FIG. 1, controller 110 is directly connected to a first device module 120. The connection with the first device module 120 interconnects the controller 110 to a series of devices modules. For example, in FIG. 1, controller 110 controls and otherwise communicate with second device module 130 and third device module 140 through the connection with the first device module 120. In one application, each device module 120, 130 and 140 is a memory module containing a plurality of interconnected memory devices. The controller 110 may correspond to a memory controller for the series of memory modules. For example, each device module 120, 130, 140 may correspond to a series of DIMM cards mounted on a common board.

The controller 110 may include a package substrate 112 and a CPU 114. The CPU 114 is mounted onto the package substrate 112. The CPU 114 may be conductively mounted using conductive balls, points or pins. The package substrate 112 is shown as being electrically connected to motherboard 115 using solder balls 118, although other forms of conductive connections such as pins, points, wires, wire bondings, or any other integrated circuit interconnection technology may also be used. The solder balls 118 may make one or more connection leads from the package substrate 112 to the motherboard 115.

The first device module 120 may include a plurality of devices 124 connected to a common module board 122. The second device module 130 and third device module 140 may include similar devices that are interconnected by respective boards as well, although the arrangement and particular devices provided on each device board may differ. Each device module 120, 130, 140 may be mounted to the motherboard 115 with a respective board connector 125, 135 and 145. With respect to first device module 120, connector 125 is mated to the motherboard 115 and includes a receiving end 127 for a bottom surface 126 of the first device module 120. The connector 125 of device module 120 may include a plurality of contact elements 123 that conductively connect selective circuits of the device module 120 to motherboard 115. The second device module 130 and the third device module 140 may be similarly connected to motherboard 115 using respective connectors 135 and 145. Under a conventional design, the contact elements 123 may be bent or otherwise non-linear when extending from motherboard 115 to module board 122. Under an embodiment such as shown with FIGS. 3A–3C, at least some of the plurality of contact elements 123 are substantially linear, so as to preserve signal integrity and promote transfer speed. Specific examples of such connectors for use with such embodiments are provided with FIG. 6.

Multiple signal lines have to be carried from the controller 110 to the first device module 120 in order to communicatively couple the controller to the first device module. Under traditional approaches, signal line connections between the controller 110 and the device module 120 are made by extending the signal lines inside the motherboard 115. This typically requires forming a series of interconnected vias for the controller 110 to the motherboard 115, and corresponding vias for the connector 125 of first device module 120 to the motherboard 115. The result is the signal lines from the controller 110 and the module board 122 are interconnected using a "via-to-via" connection from within the motherboard. This approach is problematic for several reasons. Forming vias within a motherboard has additional costs and expenses. Furthermore, there is a limited amount of space on the motherboard, and if extended via formations can be avoided, there is benefit. Lastly, vias by nature are a source of signal reflection, unwanted inductance, and signal degradation.

While the controller 110 and the device modules 120, 130 and 140 may all be connected to motherboard 115, an embodiment described herein provides for controller 110 to connect to first device module 120 using a bus 150 that eliminates, or at least substantially reduces, the need for making the connection using vias internal to or on the surface of the motherboard 115. In one embodiment, bus 50 is carried by a flex cable 160 that connects to signal traces on the package substrate 112 and to signal traces on the module board 122. In another embodiment, the bus 150 is traced, overlaid, or otherwise presented on the outside of motherboard 115. As will be described, with FIGS. 2A and 2B, the location of the connection between the bus 150 and the module board 122 facilitates high-speed signal transfer. Furthermore, the manner in which the connection incoming signal lines from bus 150 are received on the module board 122 of the first device module 120 enables high-speed data transfer with little signal degradation, with all signal ines or paths being of equal length.

In an arrangement where multiple device modules are used, a second bus 152 may connect signal lines on first device module 120 with signal lines on second device module 130. Similarly, a third bus 154 may connect signal lines on second device module 130 with signal lines on third device module 140. As illustrated with FIGS. 7A and 7B, the second bus 152 and the third bus 154 may be carried in corresponding flex cables that can be serpentined between the series of device modules 120, 130 and 140.

Figure 1B:
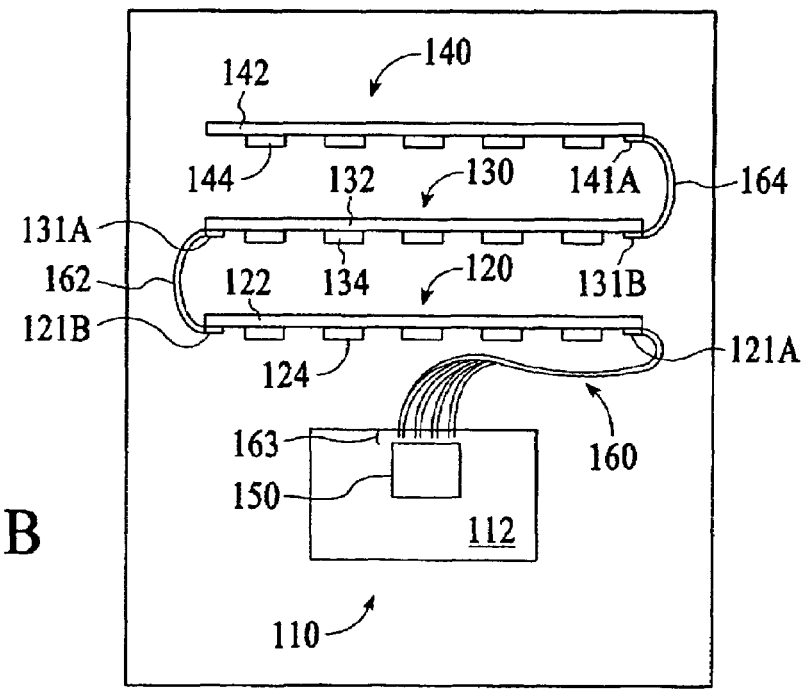
FIG. 1B is a top view of FIG. 1A.

In contrast to past and current approaches, an embodiment such as shown in FIGS. 1A and 1B avoids connecting signal lines on the package substrate 112 and module board 122 using "via-to-via" interconnections. Making a direct connection to device module 120 using bus 150 avoids signal degradation issues and other problems associated with traditional approaches for making such connections. A faster and better quality connection is made using a construction such as described, where buses external to motherboard 115 substitute for the use of vias.

FIG. 1B is a top view of FIG. 1A, according to an embodiment of the invention. In an example shown by FIG. 1B, controller 110, first device module 120, second device module 130, and third device module 140 are mounted to motherboard 115. However, bus 150 (as carried in flex cable 160) is used to directly connect controller 110 to first device module 120, as opposed to traditional interconnectivity structures that may be located within motherboard 115. Each device module 120, 130, 140 may carry a corresponding series of devices 124, 134, 144 on one or both sides of each module board 122, 132, 142 for that device module. Numerous device configurations, device types, and mountings or on-board connections are contemplated by embodiments of the invention for each device module 120, 130, 140. Some of these alternative constructions are described with other embodiments and examples provided herein.

As shown, signal lines 163 on package substrate 112 are connected to bus 150, which carried by a flex cable 160. Each device module 120, 130, 140 is edge-mounted to motherboard 115 on its bottom surface. With respect to first device module 120, flex cable 160 extends bus 150 to a lateral side 121A. Signal traces for the first device module 120 may be provided at or adjacent to lateral side 121A for purpose of connecting first device module 120 to controller 110. A second flex cable 162 may carry a second bus between signal traces provided on lateral side 121B of first device module 120, and signal traces provided on a lateral side 131A of second device module 130. A third flex cable 164 may carry a third bus between signal lines provided on a lateral side 131B of second device module 130, and signal lines provided on a lateral side 141A of third device module 140. In a serpentine configuration, additional device modules may be added, and interconnected using the side-connected bus. FIG. 2B illustrates a suitable device module construction for enabling side-connected buses to be connected to the device modules.

While embodiments such as shown by FIGS. 1A and 1B illustrate that flex cable 160 floats above motherboard 115 when extending bus 150 from package substrate 112 to module board 122, it should be noted that there are other ways to carry the bus 150. For example, the flex cable 160 may be affixed to a portion of the motherboard 115 between the package substrate 112 and the module board 122. As another example, signal lines may be at least partially carried from package substrate 112 to the module board 122, without use of a flex cable.

Furthermore, while embodiments described in FIGS. 1A and 1B, as well as elsewhere in this application, describe the controller 110 as directly connecting to the first device module 120 using bus 150, it may also be the case that bus 150 provides only one of two or more connections between the controller and the particular device module 120. Specifically, controller 110 may still include leads that are electrically coupled to the first device module 120 (or second or third device modules 130, 140) through a series of vias provided in motherboard 115. In one embodiment, not all signal lines that first device module 120 needs to receive communications from controller 110 are carried in bus 150. For example, power and ground lines (which have significantly less speed and quality requirements) may still be provided from motherboard 115 through connector 125. It is also possible to extend multiple busses such as described with bus 150 between controller 110 and one or more of the device modules 120, 130, 140.

Also, while embodiments described with FIGS. 1A and 1B illustrate use of three device modules provided on a motherboard, more or fewer device modules may be used. For example, it may be possible to mount tens or even hundreds of device modules using techniques such as described in FIGS. 1A, 1B or elsewhere in the application.

C. Device Module Design for Direct Connection with Another Motherboard Component FIG. 2 illustrates a device module design in which a plurality of board leads are arranged on a module board for purpose of facilitating or otherwise enabling faster and better quality connections to be made with the device module. In particular, device module designs such as described in FIG. 2 may be used to receive a bus in a direct board connection with that device module, as described with embodiments of FIGS. 1A and 1B.

With reference to FIG. 2, a device module 200 is shown which is configured to promote signal integrity and speed from signal connections made to the device module from a bus. The device module 200 may include a module board 222 upon which a series of devices (represented by first device 226, second device 227 and eighth device 228) are mounted or otherwise interconnected. Examples of the devices that can be mounted to the module board 222 include memory components (e.g. DRAM devices). The module board 222 may be referenced by a bottom edge 212, a top edge 216, and a pair of lateral sides 218A and 218B. The bottom edge 212 may be the side on which the device module 200 is edge-mounted to a motherboard or other substrate. Accordingly, a plurality of contact elements 219 may be provided on or near the bottom edge 212. Signal traces may interconnect each device 226–228 with other devices on the module board 222, or with the motherboard. As shown, each device 226–228 on module board 222 includes a set of trace elements 232 which extend downward to bottom edge 212.

In an embodiment, a first set of input/output points 230 is provided adjacent to lateral side 218A. A second set of input/output points 240 is provided adjacent to lateral side 218B. Each of the first set of input/output points 230 and the second set of input/output points 240 may connect to a corresponding bus to carry at least some signals to and from another device being interconnected to the device module 200. The signals introduced to the device module 200 by either of the first or second set of input/output points 230, 240 may correspond to more critical or important signals, including those in which speed and signal quality are of importance. Each device on the device module 120 may receive or transmit signals through either a high or low speed signal line. Laterally extending trace elements are part of trace element paths 235 for carrying high-speed signals. Downward extending trace elements 232 are for less critical signals, such as ground and power. Trace elements paths 235 refer to trace elements that are interconnected by the devices to form a particular path for a signal. As shown by FIG. 2, the lateral extending trace element paths 235 extend between the first and second sets of input/output points 230, 240 in a substantially linear fashion. In an embodiment such as shown, the trace element paths 235 contain no turns. The result is that each trace element 235 extends linearly between corresponding input/output points 230, 240 so as to have the same, or substantially the same length as other trace elements 235 extending between individual input/output points adjacent the lateral sides 218A, 218B. The result is that the trace elements are about the same length, and therefore have substantially identical signal conduction properties.

In contrast, prior art approaches includes turns in the trace element paths for both critical and non-critical signals. The inclusion of turns to adjust lengths of the signal traces results in added real-estate on the surface of the board module. However, the inclusion of turns in signal traces creates skew, in that some signal paths are longer than others. Also, reflection may exist as a result of impedance resulting from the turns in the signal paths. Under an embodiment such as described by FIG. 2, the trace element paths 235 extending to and from devices have the same or equivalent lengths, thereby equalizing impedance amongst signal traces. Furthermore, signal paths with equal lengths minimize or eliminating skew amongst signal traces and paths.

For a given signal received through a bus that is connected to the first set of input/output points 230, trace element paths 235 extend the signal from the first set of input/output points to a first device 226, a second device 227 and so forth until eight device 228 receives the signals. In this direction, the signals carried by trace element paths 235 may be transitioned out of the device through the second set of input/output points. This assumes that all devices on the board module 222 are intended to receive the signals from the first set of input/output traces 230. The same interconnectivity may be provided in a reverse order by trace element paths 235 when signals from an external component are received from a bus connected to the second set of input/output points 240. In this direction, the first set of input/output points 230 may correspond to the point where signals are outputted onto a bus from the device module 200.

While an embodiment such as described with FIG. 2 illustrates devices that are arranged to receive signals from the first set of input/output points 230 in series, other embodiments may provide for other patterns or means for distributing the signals from the bus. For example, the first device that receive signals from input/output points 230 may include an intermediate hub device (see e.g. FIG. 5A), which distributes signals to adjacent devices on the board module 222. Alternatively, more than one device can directly receive signals from the first set of input/output points 230.

D. Connector Connection for Device Module

FIGS. 3A and 3B are cross-sectional views of alternative embodiments in which a controller or other motherboard component is interconnected with a device module using a high-speed connection. As with embodiments described with FIGS. 1A and 1B, an embodiment such as described with FIG. 3A avoids (or reduces) the need for "via-to-via" connections between the motherboard component and the device module. However, unlike embodiments described with FIGS. 1A and 1B, a connection is made to a device module through a connector for mounting the device module to a motherboard.

With reference to FIG. 3A, a controller 310 is mounted to a motherboard 315. The controller 310 includes a CPU 314 connected to a package substrate 312. Conductive points, pins or solder balls may be used to interconnect the CPU 314 and the package substrate 312. The device module 320 is connected to motherboard 315 through connector 330. In an example provided by FIG. 3A, device module 320 includes a module board 322 having a front face 326 and a back face 327. A substrate package 324, including a CPU 325 or other component, is shown on the front face 326. Another device 329 may be provided on the back face 327. Signal traces 323 for connecting to connector 330 may be provided on one or both faces 326, 327 of the module board 322. Other devices, substrate packages and/or components may be distributed on the module board 322, on either the front face 326 or the back face 327, including in a direction that extends into or out of the paper. In one memory application for example, CPU 325 corresponds to a hub device which is accessed as a switch that distributes communications from the controller 310 to other memory devices on the module board 322. In this example, the device 329 on the back face 327 may correspond to a DIMM device.

With respect to the controller 310, package substrate 312 and motherboard 315 may be interconnected by solder balls 318. Signal traces may be extended from CPU 314 through microvias in package substrate 318. The signal traces may be extended through one or more of the solder balls 319 to the motherboard 315. However, while the controller 310 and motherboard 315 are interconnected through various vias and other connective mechanisms, a different type of high-speed connection may be formed between the controller and the device module 320. Specifically, the connection between the controller 310 and device module 320 may be made through a flex cable 360 (or similar bus structure) that eliminates, or otherwise reduces the need for vias.

In one, flex cable 360 is connected to an exterior surface 313 of package substrate 312. The exterior surface 313 may be immediately adjacent CPU 314, so that flex cable 360 can also connect to signal traces on an underside of the CPU 311. In one embodiment, flex cable 360 includes two layers, where one is for signals, and the other is for ground. Alternatively, a single layer construction may be employed. Flex cable 360 may be extended on an exterior surface 316 of motherboard 315. Alternatively, flex cable 360 may be partially or completely submerged into the substrate that is the motherboard 315. In either case, the flex cable 360 is extended to connector 330. In an embodiment such as shown, flex cable 360 is extended to a bottom surface 332 of the connector 330.

The connector 330 includes an opening 336 for receiving the bottom surface 321 of the device module 320. The connector 330 may be substantially u-shaped, with a first structure 332 adjacent to front face 326, and a second structure 334 adjacent to back face 327. In an embodiment shown by FIG. 3A, connector 330 is a hybrid connector, in that it includes two kinds of connector elements. In particular, a first plurality of connector elements 338 having a first geometric shape may extend through the first structure 332. A second plurality of connector elements 339, having a second geometric shape, extends through the second structure 334. The first plurality of connector elements 338 serve to extend electrical contact from the signal traces 323 of the module board 322 to individual signal lines carried in flex cable 360. The second plurality of connector elements 339 may serve to extend electrical contact from the signal traces 323 of the module board 322 to trace elements of the motherboard 315 and/or the flex connector 360. For reasons provided in the following paragraph, the first plurality of connector elements 338 may be used to extend high-speed connectivity between flex cable 360 and the device module 320. The second plurality of connector elements 339 may be used to extend connectivity from trace elements 323 to non-critical signal lines (e.g. power, ground, low-speed signals) of the flex cable 360, and/or to the motherboard 315.

The first plurality of connector elements 338 are better suited for carrying high-speed signals to the device module 320 because of their signal path routing. Specifically, each connector element 338 is substantially linear. Moreover, each connector element 338 may be optimally angled to shorten an overall length of that connector element. The shorter, straighter connector element 338 minimize or eliminate reflections, thereby controlling impedance, and improving signal quality and speed. In contrast, individual connector elements 339 are curved, or otherwise substantially non-linear. The geometric shape of connector elements 339 is one used in some prior art approaches. The curved nature of connector elements 339 results in reflection and uncontrolled impedance, thereby resulting in signal degradation.

FIG. 3B illustrates a design that uses an alternative connector for connecting flex cable 360 to device module 320. In particular, connector 360 may be equipped with first and second plurality of connector elements 338, where some or all of the connector elements 338 have a common geometric shape. This geometric shape is, as described with FIG. 3A, substantially linear. In addition, connector elements on the first structure 332 and second structure 334 may be optimally angled to minimize an overall length of the connector element as it extends from the motherboard 315 to trace elements 323 on the module board 322. The benefits for having linear and angled connector elements described in FIG. 3A or applicable to both first and second connector elements 338 shown in FIG. 3B.

As FIGS. 3A and 3B are both cross-sectional views, it should be notes that not all of the individual connector elements in either the first or second plurality of connector elements need to have the same geometric shape, or even be of the same kind. For example, with reference to embodiments described in either FIG. 3A or FIG. 3B, the first plurality of connector elements 338 may include traditional pin connector elements, or traditional connector elements shown by elements 339 of FIG. 3A. The traditional connector elements may be used, for example, to transfer power, ground, or low-speed signals.

While an embodiment such as shown by FIGS. 3A–3C illustrate flex cable 360 being connected to surface 313 of package substrate 312, another embodiment may provide for the flex cable 360 to be extended under the package substrate. In this configuration, flex cable 360 extends adjacent a bottom surface 317 of the package substrate 312. The flex cable 360 may be overlaid on exterior surface 316 of the motherboard 315, and make contact with package substrate 312 through one of the solder balls 318.

D. Device Module Design for Facilitating High-Speed Connection with Device Connector and Bus FIG. 4A illustrates a device module design in which a plurality of board leads are arranged on a module board for purpose of facilitating or otherwise enabling faster and better quality connections made from outside signal lines that are connected to a bottom end of a device module. Such bottom-end connections to device modules are normally made when device modules are mated or otherwise connected to motherboards using an edge-mounted motherboard connection. Examples of such edge-mounted motherboard connections are provided with FIGS. 3A and 3B, although just about any type of bottom ended connection to a device module can benefit from an embodiment such as shown by FIG. 4A.

With reference to FIG. 4A, a series of devices (represented by first device 426, second device 427 and eighth device 428) are mounted or otherwise interconnected on a module board 422. Examples of the devices that can be mounted to the module board 422 include memory components (e.g. DRAM devices). The module board 422 may be referenced by a bottom edge 412, a top edge 416, and a pair of lateral sides 418A and 418B. The bottom edge 412 may be the side on which the device module 400 is edge-mounted to a motherboard or other substrate. Accordingly, a plurality of contact points 419 may be provided on or near the bottom edge 412.

In an embodiment, a first set of input/output points 430 at or adjacent to bottom edge 412 and lateral side 418A. A second set of input/output points 440 is provided at or adjacent to top edge 416 and lateral side 418B. The result is that the first set of input/output points 430 and the second set of input/output points 440 have approximate corner positioning on the board module 422, diagonally opposed from one another. Each of the first set of input/output points 430 and the second set of input/output points 440 may connect to a corresponding bus to carry at least some signals to and from another device being interconnected to the device module 400. The signals introduced to the device module 400 by either of the first or second set of input/output points 430, 440 may correspond to more critical or important signals, including those in which speed and signal quality or of importance. Downward directed trace elements 419, on the other hand, may carry less critical signals, such as power and ground.

Signal traces may interconnect each device 426–428 with other devices on the module board 422, or with the motherboard. In an embodiment such as shown by FIG. 4A, each device 426–428 is interconnected to other devices or to the motherboard by trace elements that extend in one of two directions. These directions include a downward direction and a lateral direction. Downward extending trace elements 419 extend to or near bottom edge 412 and terminate at contact points 419. Lateral extending trace elements 435 follow substantially lateral paths between the first and second set of input/output points 430, 440, with vertical segments of the path being provided at elbows 431, 441. It should be noted that the path of each trace element 435, while being described as continuous, may in fact be segmented by individual devices 426–428. For example, the individual devices 426–428 may act as both termination and starting points (left and right sides of the devices) for each segment of a trace element path 435.

An embodiment such as shown by FIG. 4A enables bottom connections to be made to the device module 400, while at the same time preserving signal integrity and speed. In an embodiment such as shown by FIG. 4A, each trace element path 435 that initiates at input/output point 430 traverses across the board module 422 with no more than two turns or elbows. At a first elbow 431 or turn, each trace element path 435 is directed from a vertical direction into a lateral direction. These trace elements paths 435 are extended to each device 426–428 linearly, in the lateral direction. Moreover, the effective length of each trace element path as it is extended to each device 426–428 and across the board module 422 is about the same length.

Figure 4B:
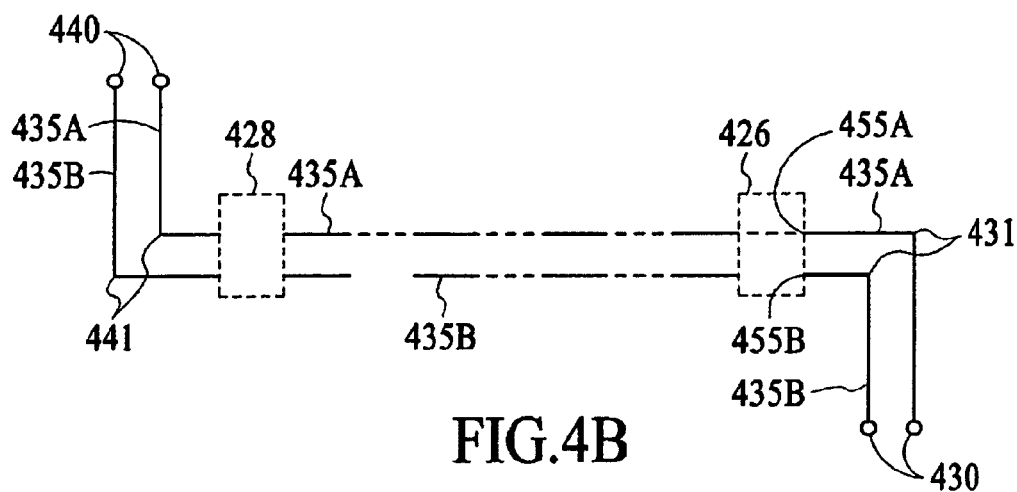
FIG. 4B is a representative drawing illustrating a design of trace element paths on a device module, according to an embodiment of the invention.

FIG. 4B is a representative drawing that illustrates trace element paths 435A, 435B on device element 400, according to an embodiment. For purpose of description, devices 426, 428 are shown in phantom. Segments of trace element paths 435A, 435B drawn in solid represent trace element segments on the module board 422. Segments of trace element paths 435A, 435B drawn in phantom illustrate where devices intercept signals of trace element segments and forward the signals onto another trace element segment of the respective trace element paths 435A, 435B. As shown by FIG. 4B, each trace element path 435A, 435B goes through an inward and outward bend in between the first and second plurality of input/output points 430, 440. The net effect is that trace element path 435A is about or substantially the same length on device module 400 as trace element path 435B. Because the trace element paths 435A and 435B are substantially the same length, skew amongst different signal paths is minimized or eliminated. This allows high-speed data to be transmitted.

In order to match the overall length of the trace element path from a side of device 426 that is proximate to the input/output points 430, the device 426 may be configured to receive trace element paths 435A, 435B in a slightly staggered alignment. The staggered alignment enables signals carried by trace elements 435A, 435B to be received by device 426 at about the same time. Signals transmitted from device 426 to input points 430 may also arrive at the input points 430 at about the same time as a result of the staggered alignment of the trace element paths 435A, 435B. This is shown by contact point 455B of trace element 435B being further within device 426 than a contact point 455A of trace element path 435A. A similar staggered arrangement may be provided for connecting device 428 to the trace elements 435A, 435B. A side of device 428 proximate to input/output points 440 may connect to segments of trace element paths 435A, 435B in a staggered alignment, so that the segments of the trace element paths 435A, 435B between the device 428 and the input/output points 440 are about the same length.

Figure 5A:
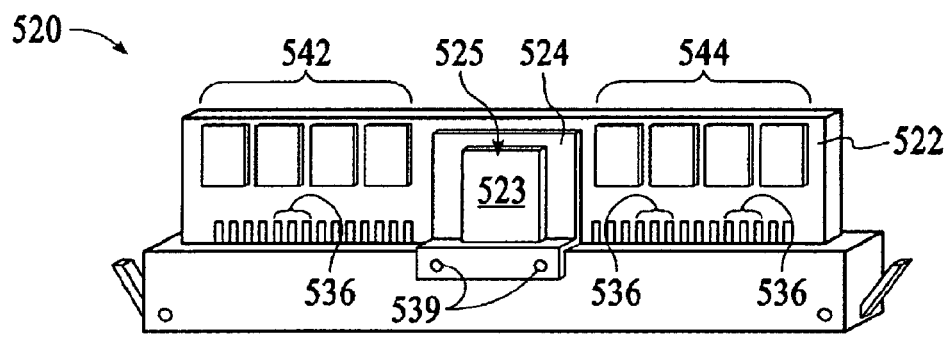
FIG. 5A is a front isometric view of a device module that is mated with a motherboard connector, according to an embodiment of the invention.

Direct Chip-To-chip Connection Between Motherboard Component and Device on Board Module While embodiments such as described by FIGS. 3A and 3B provide for extending a cable to connector elements of a connector on a motherboard in order to interconnect a motherboard component with a device module, other embodiments may provide for extending the flex cable (or other integrated bus structure) through the connector so as to make a direct connection with an element of a device module. FIG. 5A is a front isometric view of a device module 520 that is mated with a motherboard connector 530. The assembly may be provided on a motherboard (not shown in this figure). A flex cable 560 (FIG. 5B) may be provided on an interior surface 535 (FIG. 5B) of the connector 530. The device module 520 may include a hub package 525, which comprises a hub device 523 provided on a package substrate 524. The package substrate 524 in turn is connected to a module board 522. A first set of devices 542 extend to the left of the hub package 525. A second set of devices 544 extend to the right of the hub package 525.

In one application, the function of the hub package 525 includes interconnecting the first set of devices 542 and the second set of devices 544 through a connection made to the hub package 525. Each device in the first set of devices 542 and in the second set of devices 544 includes a set of trace elements 536 which extend downward to the connector 530. These trace elements 536 may either extend to the motherboard or to a position where the flex cable 560 is mated. The latter would be the case primarily for the hub package 525. Trace elements that mate with the motherboard may be reserved for power, ground, or low-speed signal elements. Trace elements that interconnect with the hub device 525 (now shown), or alternatively with the flex cable 560, may be reserved for signals that are desired for high-speed transfer.

Figure 5B:
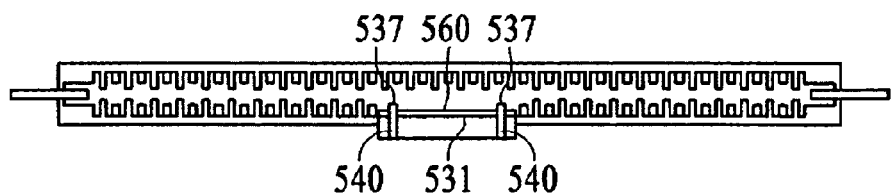
FIG. 5B is a top view of FIG. 5A, with a substrate of the device module removed from the connector, according to an embodiment of the invention.

In an embodiment such as shown by FIGS. 5A and 5B, another motherboard component (such as a controller 510 in FIG. 5C) can be directly connected to the hub package 525. The hub package 525 in turn interconnects the other motherboard component to the other devices on the device module 520. In contrast to past approaches, the connection to the hub package 525 may be made directly with a bus (e.g. as provided by flex connector 560) that extends from the other motherboard component, rather than other traditional techniques (such as using motherboard vias).

As with previously described embodiments, the set of trace elements 536 may utilize traditional connectivity to connect to trace elements on the underlying motherboard. Connectivity between hub package 525 and the flex connector 560 may use another mechanism. FIG. 5B is a top view of connector 530, showing flex cable 560 extended to a position that will cause elements of flex cable 560 to mate with trace elements on the package substrate 524. In one embodiment, hub package 525 is positioned so that package substrate 524 contacts an interior surface 531 of connector 530.

Various mechanisms for accomplishing a direct "chip-to-chip" connection between a motherboard component (e.g. controller 510) and hub package 525 using a bus (such as flex connector 560) have been described in U.S. patent application Ser. No. 10/426,930, entitled DIRECT-CONNECT SIGNALING SYSTEM, filed Apr. 29, 2003. The aforementioned patent application is hereby incorporated by reference in its entirety for all purposes. With reference to FIG. 5B, an active contact may be made between flex cable 560 and trace elements on package substrate 524. An embodiment of FIGS. 5A and 5B, for example, shows a push-pin construction that aligns flex cable 560 in making contact with contact points on an exterior surface of the package substrate 524. A traditional mechanical fastener, such as a screw or clamp may make the active connection when alignment is achieved with the push-pins. Alternatively, the push-pins may provide both alignment and an active force.

With reference to FIG. 5B, a pair of push pins 540 are shown that extend into an interior cavity 536 of connector 530. The push pins 540 may serve as an alignment mechanism by aligning with and inserting into corresponding apertures 539. A traditional fastener, such as a screw or clamp may be used to secure the package substrate 524 against the leads of the flex cable at precise contact points on the package substrate.

Figure 5C:
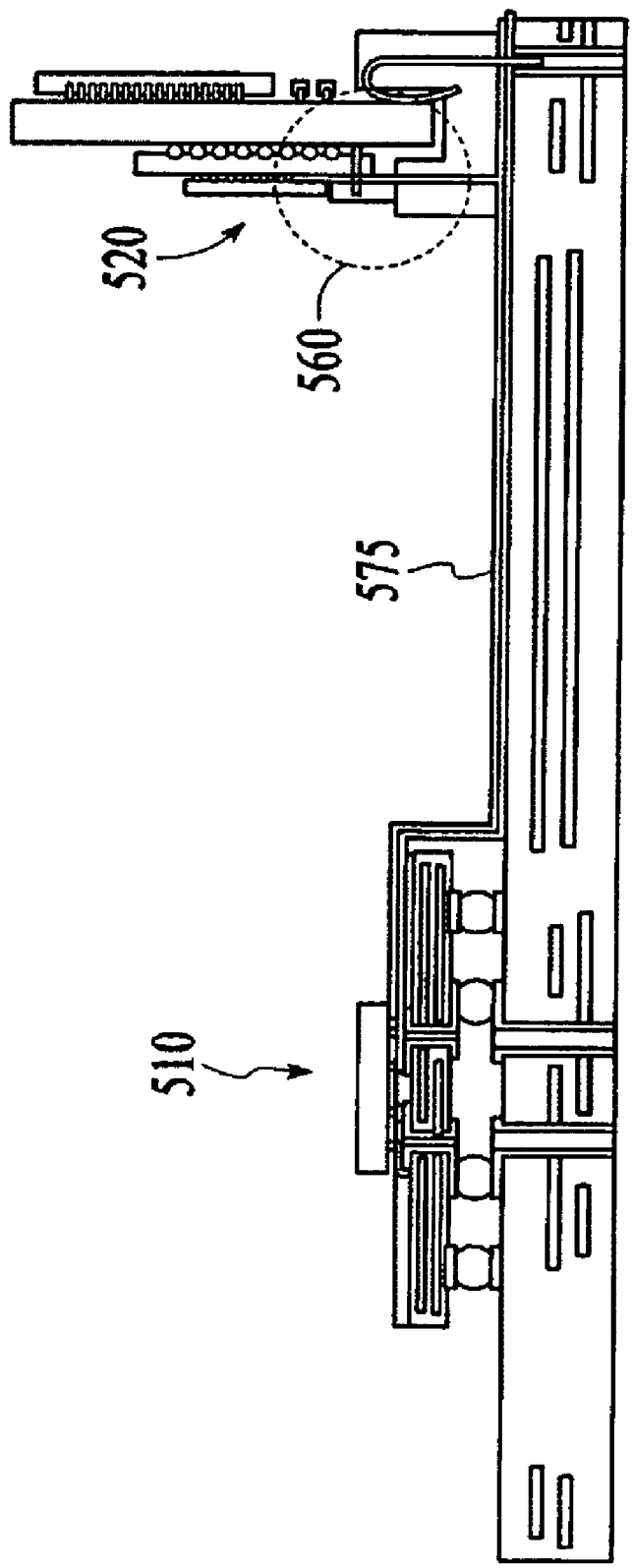
FIG. 5C is a representative cross-sectional side view of a chip-to-chip connection between a controller and a device module, according to an embodiment of the invention.

FIG. 5C is a representative cross-sectional side view of a chip-to-chip connection between a controller 510 and a device module 520. As shown, flex cable 560 is extended from a direct connection of a CPU 514 of controller 510 to hub device 523. The flex cable 560 may be fixed, suspended or submerged with respect to motherboard 515. A securement mechanism 580 (shown by circle G) may be used to actively contact leads on the flex connector 560 with contact points on the package substrate 524. This creates a direct contact between controller 510 and hub device 523.

Figure 5D:
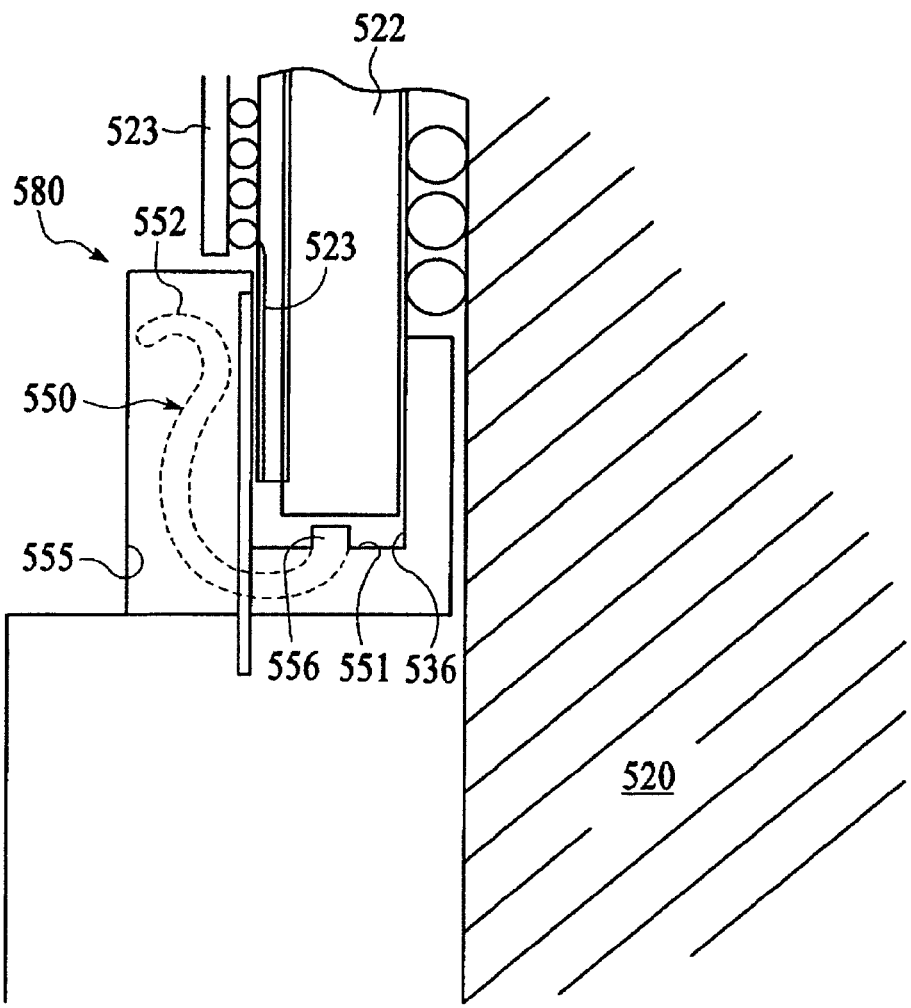
FIG. 5D is a close-up of a portion of FIG. 5C delineated by circle G, under an embodiment of the invention.

FIG. 5D is a close-up of circle G, illustrating a securement mechanism 580, under an embodiment of the invention. Securement mechanism 580 may include an S-shaped contact element 550 is embedded within an insulative section 555 of connector 530. When no device module 520 is inserted, a tail 556 of the contact element protrudes from a bottom surface 551 of the cavity 536. When board module 522 is inserted into the cavity 536, the tail 556 is moveable downward so as to become flush with bottom surface 551. This in turn causes the contact element 550 to rock or otherwise move clockwise. The contact element 550 may have a contact section 552 of that member presses against the flex cable 560 and creates an active force between individual signal lines of the flex cable and a corresponding trace element 523 on the package substrate 524. In one embodiment, the trace element 523 on the package substrate 524 may correspond to gold (or other conductive element) dots.

While FIGS. 5A–5D describe specific mechanism by which an active engagement is created for extending and connecting a bus carried in a flex cable directly to a device on a substrate of a device module, other embodiments may provide different mechanisms for creating the active engagement. For example, securement mechanism 580 may include an embedded roller that contracts upon the entrance of a substrate, then expands to force a flex cable into contact with contact points on the substrate. As an alternative, a flex cable may be provided with a specific type of connector described in U.S. patent application Ser. No. 10/608,255, entitled ARRAY CONNECTOR WITH DEFLECTABLE COUPLING STRUCTURE FOR MATING WITH OTHER COMPONENTS, filed Jun. 27, 2003. The aforementioned application is hereby incorporated by reference in its entirety.

Figure 6:
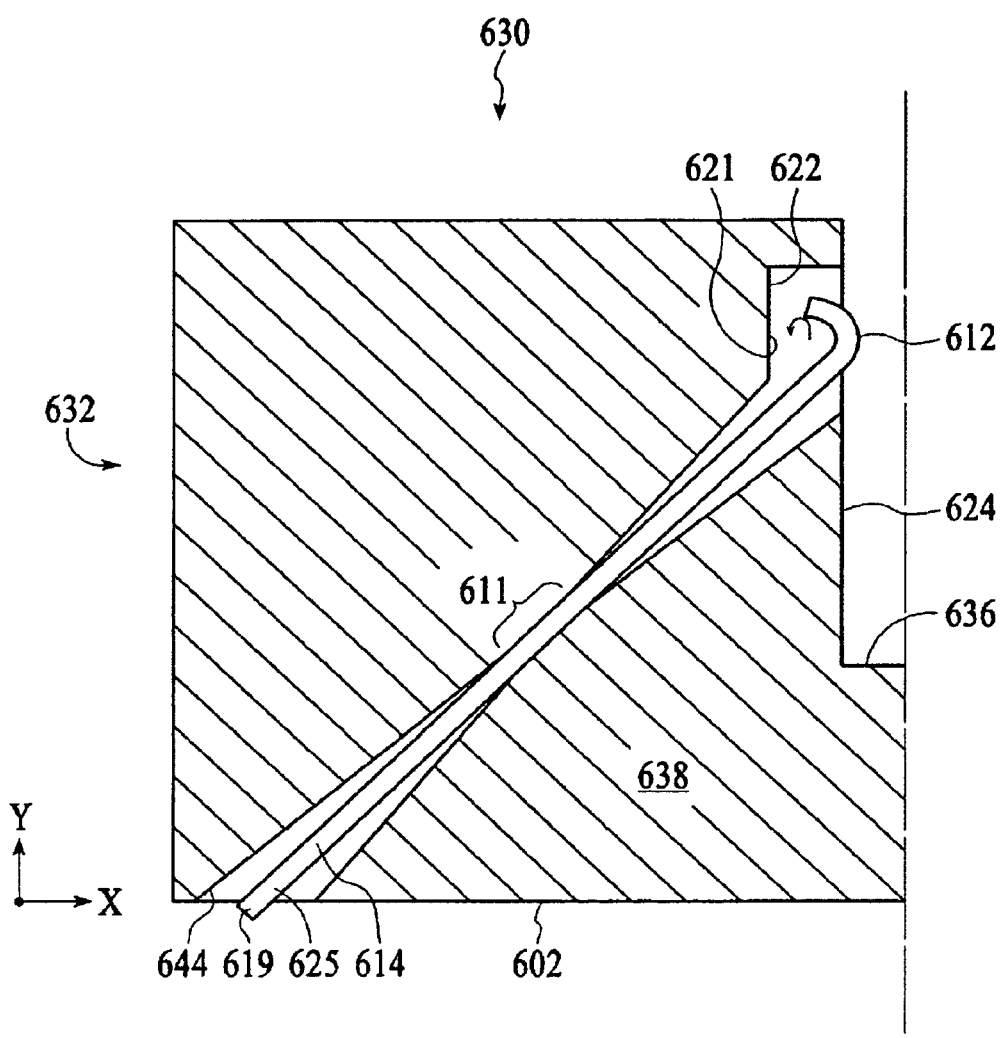
FIG. 6 illustrate a motherboard connector for mating a device module to a motherboard, under an embodiment of the invention.

Connector for Extending High-Speed Connection from Motherboard to Edge-Mounted Device Module FIG. 6 illustrate a motherboard connector for mating a device module to a motherboard, under an embodiment of the invention. A connector such as described with FIG. 6 may be used with, for example, embodiments shown and described with FIGS. 3A and 3B.

FIG. 6 is partial, side cross-sectional view of a segment 632 of a connector 630. The connector 630 includes a motherboard contact surface 602. The segment 632 may form a portion of an opening 636 in which an edge of a board module (or other substrate end) is received. A body 638 of the connector 600 may be formed by insulative materials. A series of connector tunnels 610 may be formed with the body 638. FIG. 6 illustrates one connector tunnel 610 and connector member 615. Additional tunnels and connector members may be assumed to be similarly formed in the body 638 in a direction extending into and out of the paper.

Connector member may be provided a contact point 612 in an opening 622 formed on an interior side 624 of the opening 636. In an embodiment, the contact point 612 is hooked or bent in a reverse-C or partial U-shape. The result is that contact point 612 is rounded. The opening 622 is sufficiently large to enable the contact point 612 to engage, deflect and pivot, flex, and/or allow wipe, or otherwise move about. In an embodiment, connector tunnel 610 and connector member 615 are configured to reduce an overall length that a signal must travel form motherboard to contact point 612. Accordingly, a shaft 614 of connector member 615 is substantially linear. The shaft may form at least a majority, and preferably a substantial (greater than 80%) of the overall length of the connector member 615. Furthermore, shaft 614 may be angled within the body 638. To minimize a length of shaft 614, an angle 625 between shaft 614 and a surface of the motherboard is about 45 degrees. Other embodiments may increase or decrease the angle, preferably as needed to minimize the overall length of connector member 615.

When a substrate such as module board 622 is inserted into opening 636, the effect is that a surface of the board contacts the connector member 615 at contact point 612. In an embodiment such as shown by FIG. 6, contact point 612 is moved counterclockwise, or towards an interior surface 621 of the opening 622. When contact point 612 is moved inward by the substrate, it resiliently presses back against the substrate. In turn, the substrate may be aligned so that a corresponding contact point on the substrate contacts contact point 621. An electrical connection can then be made. The same mechanism can be used to make similar electrical connections for a series of connector members distributed axially (into and out of the paper) within the body 638.

In one embodiment, the manner in which connector 630 is formed is that connector tunnel 610 is formed to accommodate a shape, length and angle of the connector member 615. Since the connector tunnel 610 and the connector member 615 are both substantially linear, it is relatively easy to insert connector member 615 into a corresponding tunnel. A tail end 619 of the connector member 615 is inserted into the tunnel first, until the tail end protrudes slightly within a tail opening 644. The tail end 619 will, when connector 630 is mated with a motherboard, make contact with a corresponding conductive element on the motherboard.

In one embodiment, tunnel 610 is shaped so that body 638 presses against a center section 611 f the connector member 610. In one embodiment, the body 638 presses on the center section 611 in order to retain the center section fixed. Alternatively, adhesive or other fasteners may be used to retain the center section 611 fixed. When the center section 611 is fixed, contact point 612, and tail end 619 flex and pivot about the center section 611.

In another embodiment, center section 611 may pivot within the body 638. For example, a protrusion or other element may be provided centrally within the tunnel 610. That region of the tunnel 610 may be slightly larger than a cross-section of the connector element, but the protrusion may prevent the connector member from being easily slid out of the connector tunnel 610. The result is that connector member 615 is moveable within connector tunnel 610.

Multi-Device Module Interconnections

Figure 7A:
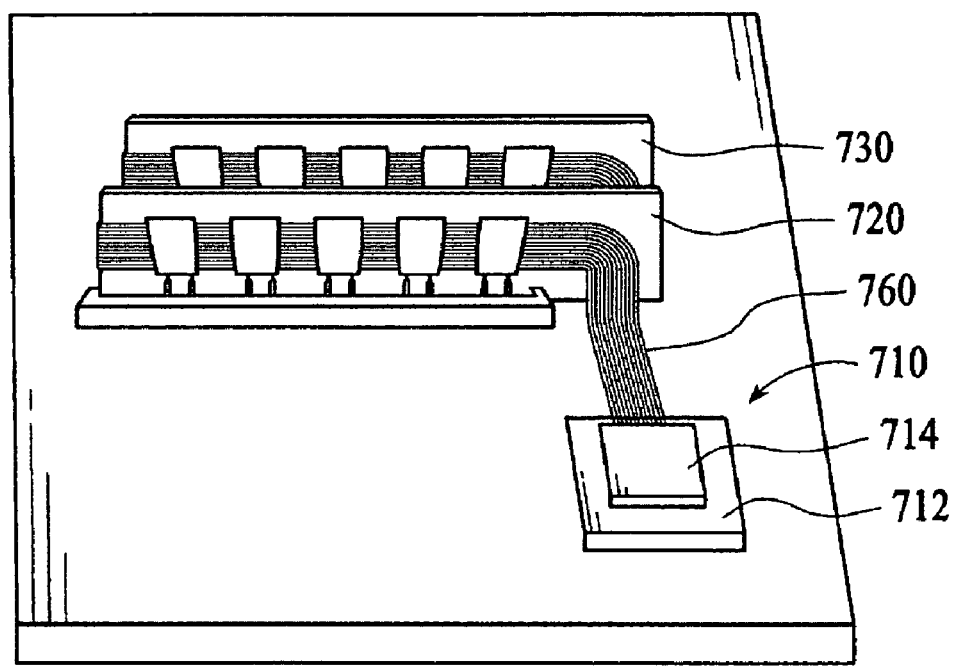
FIGS. 7A–7C illustrate different embodiments in which device modules are interconnected to one another on a motherboard using bus connections.
Figure 7B:
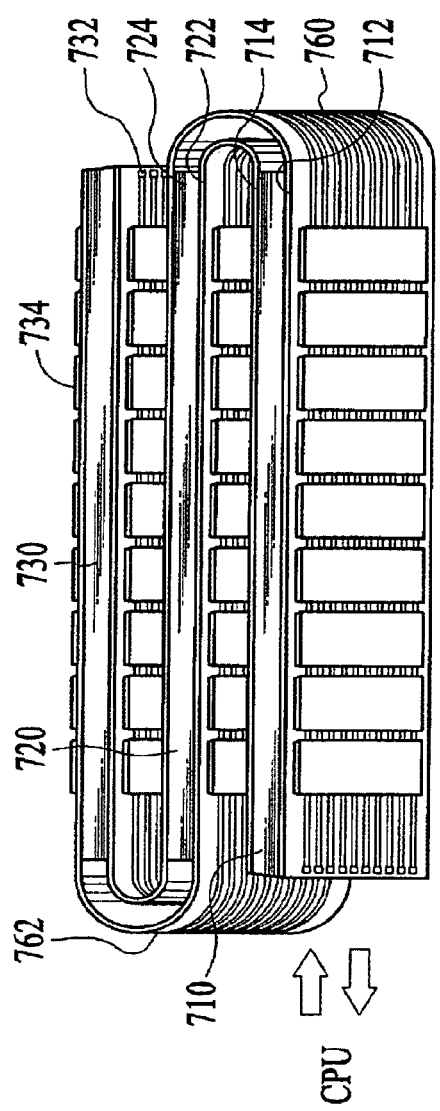
Figure 7C:
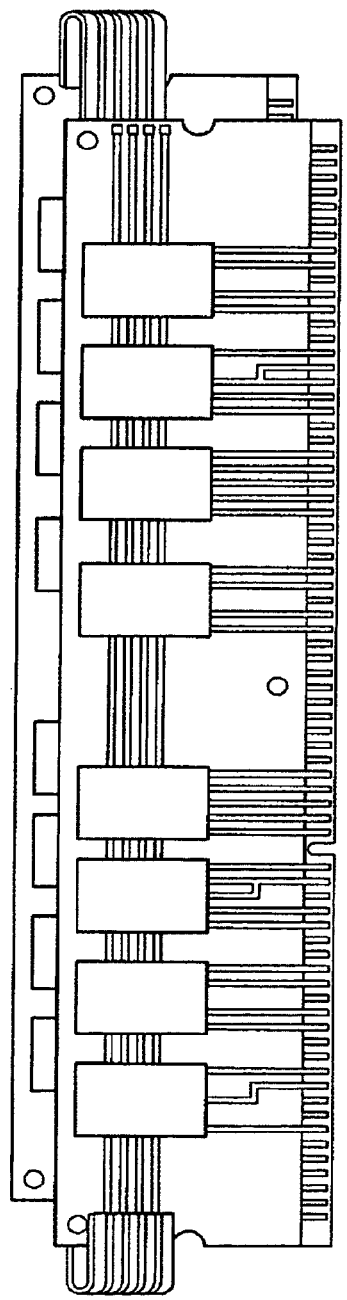

Edge-mounted device modules may be combined together on motherboards in various arrangements. For example, such modules may be interconnected in series for purpose of communicating with one other motherboard component or controller. FIGS. 7A–7C illustrate different embodiments in which multiple device modules are interconnected.

In FIG. 7A, a controller 710, having a CPU 714 and substrate 712, are mounted to a first section of a motherboard 715. Multiple (two or more) device modules 720, 730 are positioned across from the controller 710 on the motherboard 715, using motherboard connectors. The motherboard connectors may be convention, or as described in FIGS. 3A, 3B and 6.

A bus may interconnect controller 710 with the first device module 720, and then with the second device module 730 in series. The bus may be extended with a flex cable 760. The flex cable 760 may be of a rigid-flex connection. The first device module 720 is provided the flex cable 760 as an integral (permanently fixed) component. A side mount (such as described by FIGS. 1A, 1B and 2) may be used to join the flex cable 760 with the first device module 720.

FIG. 7B illustrates a series of board modules interconnected side-to-side. Each board module 710, 720, 730 in the series may be two-sided, so that devices are located on both the front face 712 and back face 714 of each module. Two flex cables 760, 762 may be provided. A first flex cable 760 connects front face 712 of first module 720 with a back face 724 of second board module 720 and then with a front face 732 of the third device module 730. The second flex cable 762 connects the back face 714 of the first device module with a front face 722 of the second device module, and then a back face 734 of the third device module 730. Each flex cable to device module connection may be accomplished through a side connection, as described with embodiments in FIGS. 1 and 1B. Furthermore, front and back faces of each device module 710, 720 and 730 may have trace element path designs to facilitate high-speed data transfer and side mounted flex cables. Such designs are describe with FIG. 2, and elsewhere in the application.

FIG. 7C illustrates a signal trace design on a board module where side-mounted flex busses are used to interconnect that board module with other board modules. The trace element path design may be similar to embodiments described above, including with FIG. 2.

While certain aspects of the system for embodiments of the invention are presented below in certain claim forms, the inventors contemplates the various aspects of the system in any number of claim forms. Accordingly, the inventor reserves the right to add additional claims after filing the application to pursue such additional claim forms for other aspects of the system for maintaining electronic files.

What we claim is:

1. A device module comprising:
   a circuit board;
   a plurality of devices mounted to a first side of the circuit board;
   a first set of contact points provided adjacent to a first lateral edge of the circuit board for connecting to a first external data bus;
   a second set of contact points provided adjacent to a second lateral edge of the circuit board for connecting to a second external data bus;
   a plurality of signal paths provided on the circuit board, each signal path extending between a first contact point in the first set of contact points and a second contact point in the second set of contact points, wherein the plurality of signal paths are interconnected to at least some of the plurality of devices mounted on the circuit board;
   wherein the first lateral edge of the circuit board and the second lateral edge of the circuit board are provided on the first side of the circuit board; and
   wherein each of the plurality of signal paths has substantially an identical length and a same number of one or more turns on the board.

2. The device module of claim 1, wherein the circuit board includes a bottom edge that is configured to be edge-mounted to a substrate, and wherein one of the first set of contact points for at least some of the plurality of signal paths is provided adjacent to the bottom edge and is proximate to one of a first lateral edge and a second lateral edge, and wherein for each of the contact points provided adjacent to the bottom edge and proximate to one of the first and second lateral edges, a corresponding signal path has two turns on the circuit board.

3. The device module of claim 1, wherein the board includes a bottom edge that is configured to be edge-mounted to a substrate, and a first lateral edge and a second lateral edge that extend from the bottom edge, and wherein each contact point in the first set of contact points is provided on or adjacent to one of the first lateral edge or the second lateral edge, and wherein for each contact point in the first set, a corresponding signal path extends to a corresponding contact point in the second set, and wherein said corresponding signal path has less than two turns on the board.

4. The device module of claim 1, wherein at least some of the plurality of components are memory devices.

5. A system for providing high-speed interconnectivity between a controller and a plurality of memory devices, the system comprising:
   a set of one or more boards upon which a plurality of memory devices are provided, wherein the set includes at least a first board on which at least some of the plurality of memory devices are provided;
   a plurality signal paths provided on the first board, wherein each signal path in the plurality of signal paths includes a first set of contact points that interconnect the first board to the controller from a position that is proximate to a first lateral side of the first board, and a second set of contact points that interconnect the board to another component from another position that is proximate to a second lateral side of the first board, and wherein each of the plurality of signal paths has a substantially identical length and an identical number of one or more turns between a contact point in the first set of contact points and a contact point in the second set of contact points;
   wherein the plurality of signal paths have no vias; and
   a bus connected to the first set of contact points and communicatively coupled to the controller.

6. The system of claim 5, wherein the bus is provided through a flex cable.

7. The system of claim 6, wherein an end of the flex cable is directly connected to the controller.

8. The system of claim 5, wherein the first board is edge-mounted to a motherboard on a bottom side, and wherein a contact point in the first set of contact points for at least some of the plurality of signal paths is provided adjacent to a bottom edge, and wherein for each contact point provided adjacent to the bottom edge, the signal path of that contact point has two turns on the board.

9. The system of claim 5, wherein the first set of contact points and the second set of contact points are positioned on the first board so that the signal path extending between a a contact point in the first set of contact points and a contact point in the second set of contact points has less than two turns on the board.

10. The system of claim 5, wherein the first set of contact points and the second set of contact points are positioned on the first board so that the signal path extending between a contact point in the first set of contact points and a contact point in the second set of contact points has zero turns on the board.

11. The system of claim 5, further comprising a motherboard upon which the controller and the set of one or more boards are mounted, and wherein the bus is external to the motherboard.

12. The system of claim 5, wherein the first board is connected to a second board in the set via a second bus provided on a flex cable.

13. The system of claim 12, wherein the first board and the second board are each mounted to a motherboard.

14. A system comprising:
   a first module and a second module, each of the first module and second module comprising:
   a circuit board;
   a plurality of devices mounted to a first side of the circuit board;
   a first set of contact points provided on a first lateral end adjacent to a first edge of the circuit board for connecting to a first external data bus;
   a second set of contact points provided on a second lateral end adjacent to a second edge of the circuit board for connecting to a second external data bus; and
   a plurality of signal paths provided on the circuit board, each signal path extending between a first contact point in the first set of contact points and a second contact point in the second set of contact points; wherein the plurality of signal paths are interconnected to at least some of the plurality of devices mounted on the circuit board;
   wherein the first edge of the circuit board and the second edge of the circuit board are provided on the first side of the circuit board; and wherein each of the plurality of signal paths has substantially an identical length and a same number of turns on the board; and wherein with respect to a common reference point of the first module and the second module, (i) the first lateral end of the first device module and the second device has a same leftward or rightward orientation, and (ii) the second lateral end of both of the first device module and the second device module is has a same leftward or rightward orientation; and wherein the system further comprises a flexible circuit connected to the first module and the second module, the flexible circuit comprising one or more signal paths forming a bus for conveying signals from the second set of contact points of the first module to the first set of contact points of the second module.

15. The system of claim 14, further comprising:

a printed circuit board; and a second flexible cable having one or more signal paths that connect to the first set of contact points of the first module and the printed circuit board, so as to form a bus for conveying signals from the first module to the printed circuit board.

16. The system of claim 14 further comprising:

a controller;

a second flexible cable having one or more signal paths that connect to the first set of contact points of the first module and the printed circuit board, so as to form a bus for conveying signals from the first module to the printed circuit board.

* * * * *